(12) United States Patent
Inoue et al.

(10) Patent No.: US 8,390,124 B2
(45) Date of Patent: Mar. 5, 2013

(54) SEMICONDUCTOR DEVICE AND METHOD OF MANUFACTURING SEMICONDUCTOR DEVICE INCLUDING WIRING VIA AND SWITCH VIA FOR CONNECTING FIRST AND SECOND WIRINGS

(75) Inventors: Naoya Inoue, Kanagawa (JP); Yoshihiro Hayashi, Kanagawa (JP); Kishou Kaneko, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 378 days.

(21) Appl. No.: 12/656,728

(22) Filed: Feb. 16, 2010

(65) Prior Publication Data

US 2010/0207093 A1 Aug. 19, 2010

(30) Foreign Application Priority Data

Feb. 17, 2009 (JP) .................................. 2009/34117

(51) Int. Cl.
*H01L 23/48* (2006.01)
*H01L 23/52* (2006.01)
*H01L 29/40* (2006.01)
*H01L 29/32* (2006.01)
*H01L 29/74* (2006.01)
*H01L 31/111* (2006.01)
*H01L 29/423* (2006.01)
*H01L 29/49* (2006.01)

(52) U.S. Cl. ........ 257/758; 257/107; 257/130; 257/131; 257/155; 257/156; 257/160; 257/161; 257/774; 257/E27.052; 257/E27.079; 257/E27.132; 257/E29.029; 257/E29.036; 257/E29.037; 257/E29.038; 257/E29.043; 257/E29.046; 257/E29.047; 257/E29.048; 257/E29.113; 257/E29.123; 257/E29.125; 257/E29.181; 257/E29.197; 257/E29.224; 257/E29.225; 257/E29.337; 257/E45.002; 257/E45.003; 257/E45.004

(58) Field of Classification Search .................. 257/107, 257/130, 131, 155, 156, 160, 161, 758, 774, 257/E27.052, E27.079, E27.132, E29.029, 257/E29.036, E29.037, E29.038, E29.043, 257/E29.046, E29.047, E29.048, E29.113, 257/E29.123, E29.125, E29.181, E29.197, 257/E29.224, E29.225, E29.337, E45.002, 257/E45.003, E45.004

See application file for complete search history.

(56) References Cited

U.S. PATENT DOCUMENTS 6,031,445 A * 2/2000 Marty et al. .................. 336/200
6,949,832 B2 * 9/2005 Kunishima et al. ........... 257/762

(Continued)

FOREIGN PATENT DOCUMENTS

| JP | 2001-28397 | 1/2001 |
|---|---|---|
| JP | 2008-34434 | 2/2008 |
| JP | 2008305888 A * | 12/2008 |

OTHER PUBLICATIONS

Tzu-Ning Fang, et al., "Erase Mechanism for Copper Oxide Resistive Switching Memory Cells with Nickel Electrode", IEDM2006, Session 30-6, 2006.

*Primary Examiner* — Ida M Soward
(74) *Attorney, Agent, or Firm* — McGinn IP Law Group, PLLC (57) ABSTRACT

Provided is a semiconductor device including a substrate, and a first wiring layer, a second wiring layer, and a switch via formed on the substrate. The first wiring layer has first wiring formed therein and the second wiring layer has second wiring formed therein. The switch via connects the first wiring and the second wiring. The switch via includes at least at its bottom a switch element including a resistance change layer. A resistance value of the resistance change layer changes according to a history of an electric field applied thereto.

20 Claims, 8 Drawing Sheets

U.S. PATENT DOCUMENTS

| | | | |
|---|---|---|---|
| 7,411,301 B2 * | 8/2008 | Funakoshi et al. | 257/758 |
| 7,462,900 B2 * | 12/2008 | Hideki et al. | 257/300 |
| 7,518,243 B2 * | 4/2009 | Tokumine | 257/758 |
| 7,586,175 B2 * | 9/2009 | Lee et al. | 257/620 |
| 7,687,830 B2 * | 3/2010 | Pellizzer et al. | 257/214 |
| 7,692,230 B2 * | 4/2010 | Liaw et al. | 257/296 |
| 7,701,060 B2 * | 4/2010 | Tada et al. | 257/758 |
| 7,768,127 B2 * | 8/2010 | Yamada et al. | 257/758 |
| 2005/0285173 A1 * | 12/2005 | Nagai et al. | 257/296 |
| 2006/0157854 A1 * | 7/2006 | Takewaki et al. | 257/758 |
| 2006/0202343 A1 * | 9/2006 | Huang et al. | 257/758 |
| 2007/0029676 A1 * | 2/2007 | Takaura et al. | 257/758 |
| 2008/0054243 A1 | 3/2008 | Shima et al. | 257/2 |
| 2008/0105947 A1 * | 5/2008 | Kuzuhara et al. | 257/506 |
| 2008/0122102 A1 * | 5/2008 | Sakata et al. | 257/763 |
| 2009/0020742 A1 * | 1/2009 | Sunamura et al. | 257/4 |
| 2009/0115062 A1 * | 5/2009 | Kageyama | 257/758 |
| 2009/0243109 A1 * | 10/2009 | Nopper et al. | 257/758 |
| 2009/0250680 A1 * | 10/2009 | Takaura et al. | 257/2 |
| 2009/0298203 A1 * | 12/2009 | Nagai | 438/3 |
| 2009/0309186 A1 * | 12/2009 | Inoue et al. | 257/532 |
| 2010/0258779 A1 * | 10/2010 | Mikawa et al. | 257/2 |
| 2010/0283026 A1 * | 11/2010 | Mikawa et al. | 257/2 |

* cited by examiner

SEMICONDUCTOR DEVICE AND METHOD OF MANUFACTURING SEMICONDUCTOR DEVICE INCLUDING WIRING VIA AND SWITCH VIA FOR CONNECTING FIRST AND SECOND WIRINGS

BACKGROUND OF THE INVENTION

1. Field of the Invention

The present invention relates to a semiconductor device and a method of manufacturing a semiconductor device.

2. Description of the Related Art

As more and more precise technologies are necessary for manufacturing a semiconductor device, the cost of a mask for photolithography used in forming a circuit pattern necessary for performing a desired function increases, and, as a result, the price of a semiconductor chip increases. In order to avoid such a problem of the cost of the mask, a semiconductor chip referred to as a field programmable gate array (FPGA) having a function which is programmable according to the purpose of the chip is sometimes used. The FPGA may perform various functions by changing its circuit configuration with a switch. Typically used as the switch is a static random access memory (SRAM) device including a plurality of transistors. In such device, information on the configured function is lost when the power is shut down, and hence the information on the function needs to be read again when the device is used next time.

On the other hand, for example, an FPGA using an anti-fuse as disclosed in Japanese Patent Application Laid-open No. 2001-28397 prevents loss of the circuit function by fixing the function in the initial stages. An anti-fuse often has a structure in which a pair of electrodes formed in two different wiring layers sandwiches a dielectric. Normally, a dielectric is of high resistance, but, when high voltage is applied between the pair of electrodes, the resistance value of the dielectric makes a high to low transition. By selectively applying high voltage to a specific anti-fuse layer, a desired function may be realized on a gate array.

Japanese Patent Application Laid-open No. 2008-34434 discloses a resistance change device including a metal oxide thin film having reversible variable resistance characteristics. The device has a structure in which a metal oxide containing a transition metal and oxygen is formed between a first electrode and a second electrode, and the resistance value reversibly changes according to a history of voltage applied between the electrodes.

Figure 10:
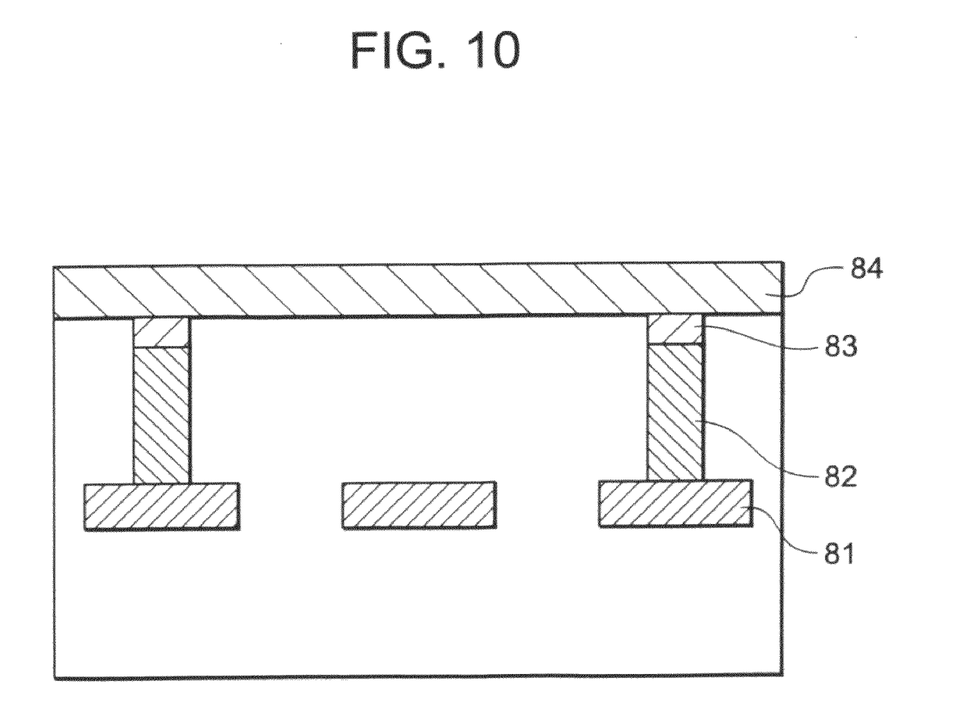
FIG. 10 is a sectional view illustrating a configuration of a device structure described in Tzu-Ning Fang, et al.

Tzu-Ning Fang, Swaroop Kaza, Sameer Haddad, An Chen, Yi-Ching (Jean) Wu, Zhida Lan, Steven Avanzino, Dongxiang Liao, Chakku Gopalan, Seungmoo Choi, Sara Mandavi, Matthew Buynoski, Yvonne Lin, Christie Marrian, Colin Bill, Michael VanBuskirk and Masao Taguchi, "Erase Mechanism for Copper Oxide Resistive Switching Memory Cells with Nickel Electrode", IEDM 2006, Session 30-6 proposes a device structure having a resistance change device incorporated therein as a memory device. FIG. 10 is a sectional view illustrating the structure. Lower layer wiring 81, a via plug 82 formed by embedding copper, a resistance change layer 83 formed by forming cuprous oxide $Cu_2O$ through oxidation of an uppermost surface of the via plug, and an upper wiring layer 84 which also serves as an upper electrode are provided in the structure. The structure is used as a memory device utilizing a characteristic of $Cu_2O$ that, by an electric field applied thereto, the resistance value thereof after the electric field is eliminated changes. The resistance change is reversible, and the resistance value may be changed many times.

However, the semiconductor device disclosed in Japanese Patent Application Laid-open No. 2001-28397 has a problem in a process of patterning the anti-fuse layer immediately above lower wiring. More specifically, when the anti-fuse is patterned immediately above the wiring, the wiring is oxidized by an oxidizing gas used when a photoresist is removed after the patterning.

Further, in the structure disclosed in Tzu-Ning Fang, et al., the upper wiring layer which also serves as the electrode is provided above $Cu_2O$ as the resistance change layer. However, if copper wiring formed by a damascene process, which is generally used, is used as the upper wiring layer, a problem arises that, when a wiring groove is formed, the resistance change layer above the via plug is exposed to an etching atmosphere to be damaged or removed.

As described above, it is difficult to form in multilayer wiring a switch element including a resistance change layer having a resistance value which changes by the history of the applied electric field and to suppress damage of the surface of the wiring or of the resistance change layer.

SUMMARY OF THE INVENTION

According to the present invention, there is provided a semiconductor device including:
a substrate;
a first wiring layer formed on the substrate;
first wiring formed in the first wiring layer;
a second wiring layer located above the first wiring layer;
second wiring formed in the second wiring layer; and
a switch via for connecting the first wiring and the second wiring,
the switch via including at least at a bottom thereof a switch element, the switch element including a resistance change layer having a resistance value that changes according to a history of an electric field applied thereto.

According to the present invention, the resistance change layer is formed at least at the bottom of the switch via, and hence it is not necessary to provide a resistance change layer on a surface of the switch via. Therefore, deterioration of the resistance change layer in a process of forming a wiring groove above the switch via is suppressed. Further, the resistance change layer is formed at least at the bottom of the switch via, and hence the wiring is not exposed to an atmosphere in a process of forming the resistance change layer. Therefore, the switch element including the resistance change layer having a resistance value which changes by the history of the applied electric field may be formed in multilayer wiring, and in addition, damage of the surface of the wiring or of the resistance change layer may be suppressed.

According to the present invention, there is provided a method of manufacturing a semiconductor device including:
forming a first wiring layer on a substrate, the first wiring layer having first wiring formed therein;
forming a first via interlayer insulating film on the first wiring layer;
forming a via hole for a switch element in the first via interlayer insulating film, the via hole for a switch element being located on the first wiring;
forming a resistance change layer at least at a bottom of the via hole for a switch element; and
forming a second wiring layer on the first via interlayer insulating film, the second wiring layer having second wiring formed therein, the second wiring being connected to the resistance change layer.

According to the present invention, the switch element including the resistance change layer having the resistance value which changes by the history of the applied electric field may be formed in multilayer wiring, and in addition, damage of the surface of the wiring or of the resistance change layer may be suppressed.

DETAILED DESCRIPTION OF THE INVENTION

Embodiments of the present invention are described in the following with reference to the attached drawings. It is to be noted that, throughout the drawings, like reference numerals are used to designate like or identical components and description thereof is omitted as appropriate.

First Embodiment

Figure 1:
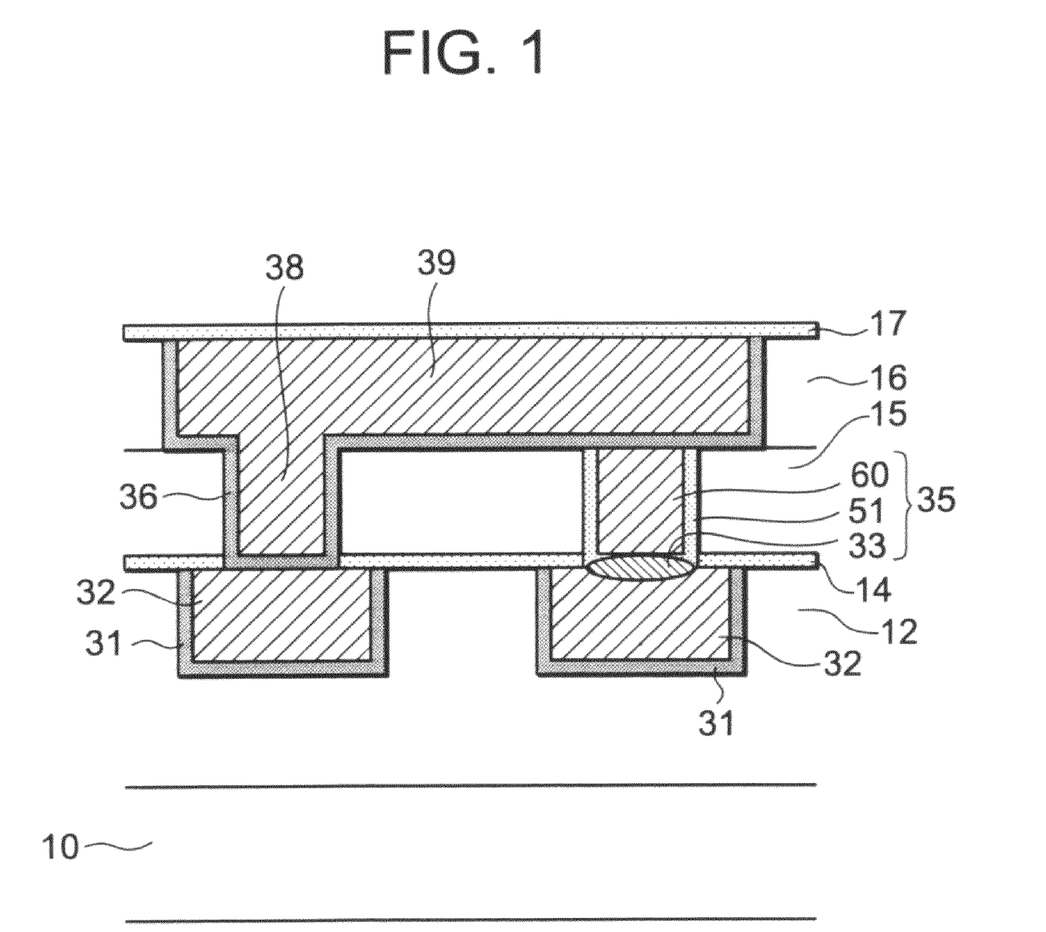
FIG. 1 is a sectional view illustrating a configuration of a semiconductor device according to a first embodiment of the present invention.

FIG. 1 is a sectional view illustrating a configuration of a semiconductor device according to a first embodiment. The semiconductor device includes a substrate 10, a first wiring layer 12, a second wiring layer 16, and a switch via 35. The substrate 10 is a semiconductor substrate made of, for example, silicon, and has an active element such as a transistor formed thereon. The first wiring layer 12 is formed on the substrate 10. The first wiring layer 12 includes first wiring 32 while the second wiring layer 16 includes second wiring 39. The switch via 35 connects the first wiring 32 and the second wiring 39. Further, the switch via 35 includes at least at its bottom a switch element which has a resistance change layer 33. The resistance value of the resistance change layer 33 changes according to the history of the applied electric field. The resistance change layer 33 is, for example, a metal oxide layer such as an oxide layer of copper. The resistance change layer 33 is not formed on an upper surface of the switch via 35.

The semiconductor device is a semiconductor device having multilayer (two or more layers of) wiring on the substrate 10. The first wiring layer 12 is an arbitrary wiring layer. The first wiring 32 is mainly formed of copper, and includes a barrier metal 31. Although not shown, located below the first wiring layer 12 is a via layer or a contact layer for connection with a wiring layer or a complementary metal oxide semiconductor (CMOS) transistor therebelow. A first wiring cap layer 14 is provided on a surface of the first wiring layer 12. The first wiring cap layer 14 prevents oxidation of the first wiring 32 and suppresses outward diffusion of a material forming the first wiring 32.

A part of the first wiring 32 is connected to dual damascene wiring which includes a wiring via 38 and the second wiring 39. The dual damascene wiring is formed of metal containing copper as a main element, and includes a barrier metal 36. Another part of the first wiring 32 is connected to the switch via 35. In this embodiment, the number of the switch via 35 is one, and, as described above, the dual damascene wiring includes the wiring via 38. The wiring via 38 is formed in a layer in which the switch via 35 is also formed. However, it is not necessary that the wiring via 38 and the switch via 35 are formed in a same process. The wiring via 38 connects the first wiring 32 and the second wiring 39, and does not include a switch element.

As described above, the switch element is formed at the bottom of the switch via 35. The switch via 35 is formed of a metal layer 60 except for the switch element. The metal layer 60 is located above the resistance change layer 33. The metal layer 60 is, similarly to the damascene wiring, formed of metal containing copper as a main element, and is embedded in the switch via 35. Further, an upper electrode layer 51 is provided between the metal layer 60 and the resistance change layer 33. The upper electrode layer 51 is formed on an upper surface of the resistance change layer 33 and on a side of the switch via 35. More specifically, the first wiring 32 is a lower electrode of the switch element, and the switch element has a structure in which the lower electrode and the upper electrode layer 51 sandwiches the resistance change layer 33.

Because the switch via 35 may be formed by a single damascene process, dry-etching with plasma process of the metal layer 60 which is an upper electrode is unnecessary, and thus, the number of the process steps may be decreased. Further, because an upper portion of the switch via 35 is connected to ordinary dual, damascene wiring, the structure of the wiring portion remains completely compatible with a conventional device.

It is to be noted that, in this embodiment, the resistance change layer 33 is directly connected to the first wiring 32. Further, the first wiring 32 and the second wiring 39 are formed of metal containing 95 wt % or more copper. The second wiring layer 16 is a wiring layer which is immediately above the first wiring layer 12, and includes a second wiring cap film 17 which covers the second wiring 39.

Next, a method of manufacturing the semiconductor device illustrated in FIG. 1 is described with reference to FIGS. 2 to 4. It is to be noted that, in FIG. 2 and subsequent figures, the substrate 10 illustrated in FIG. 1 is omitted. The method of manufacturing the semiconductor device includes: forming the first wiring layer 12 on the substrate 10, the first wiring layer 12 having the first wiring 32 formed therein; forming a first via interlayer insulating film 15 on the first wiring layer 12; forming a via hole 21 for the switch element in the first via interlayer insulating film 15, the via hole 21 being located on the first wiring 32; forming the resistance change layer 33 at least at the bottom of the via hole 21 for the switch element; and forming the second wiring layer 16 on the first via interlayer insulating film 15, the second wiring layer 16 having the second wiring 39 formed therein, the second wiring 39 being connected to the resistance change layer 33. The manufacturing method is described in more detail in the following.

Figure 2A:
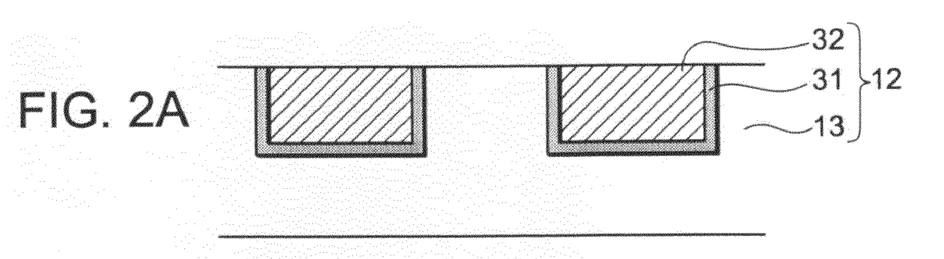
FIGS. 2A to 2D are sectional views illustrating a method of manufacturing the semiconductor device illustrated in FIG. 1.

First, as illustrated in FIG. 2A, the first wiring layer 12 is formed by the damascene process on the substrate 10 illustrated in FIG. 1. More specifically, an interlayer insulating film 13 is formed on the substrate 10. Then, a wiring groove to be a wiring pattern is formed in the interlayer insulating film 13 by etching. Then, a film of the barrier metal 31 is formed in the wiring groove by physical vapor deposition (PVD), chemical vapor deposition (CVD), or the like. One or more metal layers containing Ta, Ti, or a nitride thereof are used as the barrier metal 31. It is to be noted that the wiring groove may have at its bottom a via hole for connection with lower layer wiring. Then, metal containing copper as a main element is embedded in the entire wiring groove or in the entire wiring groove and via hole by any one of PVD, CVD, and plating, or a combination thereof. Finally, excess metal is removed by chemical mechanical polishing (CMP) such that the wiring metal (that is, first wiring 32) is embedded only in the groove.

Figure 2B:
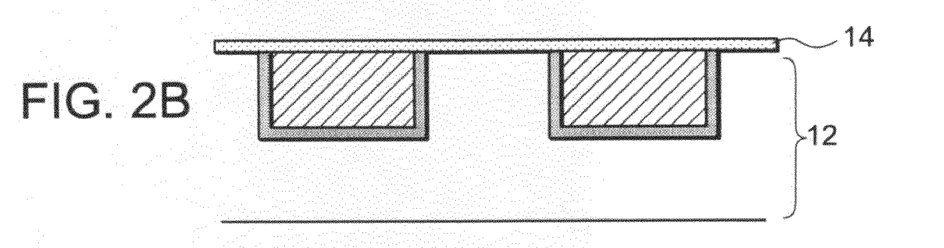

Then, as illustrated in FIG. 2B, the first wiring cap film 14 is formed by CVD so as to cover the first wiring 12. An insulating film containing at least two elements of silicon, carbon, and nitrogen is used as the first wiring cap film 14.

Figure 2C:
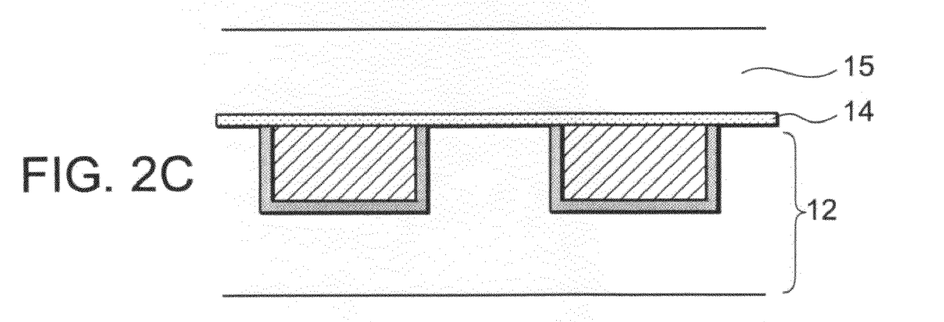

Then, as illustrated in FIG. 2C, the first via interlayer insulating film 15 is formed by CVD on the first wiring cap layer 14. The first via interlayer insulating film 15 contains without fail oxygen and at least one element of silicon and carbon, and may also contain hydrogen.

Figure 2D:
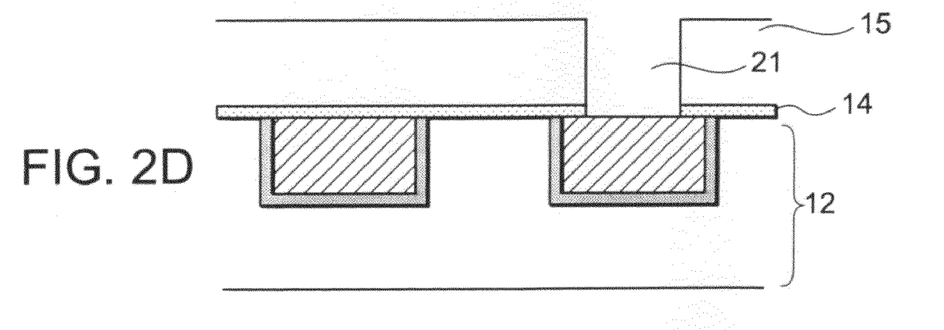

Then, as illustrated in FIG. 2D, the via hole 21 for the switch element is opened in the first via interlayer insulating film 15 until the first wiring layer 12 is reached. More specifically, a mask pattern (not shown) for opening the via hole 21 for the switch element is formed by photolithography, and the via hole 21 for the switch element is opened until the first wiring cap layer 14 is reached, with the mask pattern being used as an etching mask. Then, after the mask pattern is removed by an active atmosphere such as oxygen plasma, etching is carried out with respect to the entire surface to remove the first wiring cap layer 14 exposed at the bottom of the via hole 21 for the switch element.

Figure 3E:
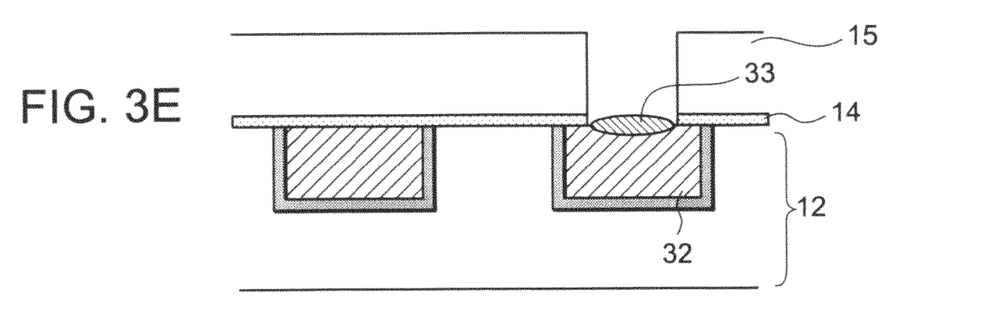
FIGS. 3E to 3G are sectional views illustrating the method of manufacturing the semiconductor device illustrated in FIG. 1.

Next, as illustrated in FIG. 3E, by oxidizing a surface of the first wiring 32 exposed at the bottom of the via hole 21 for the switch element, the resistance change layer 33 is formed. When the first wiring layer 12 is formed of metal containing copper as a main element, copper oxide is used as the resistance change layer 33. In order to oxidize metal, oxygen and energy for promoting the oxidation are necessary. When the energy is given in the form of heat, a relatively high temperature is necessary, which causes problems such as deterioration of the first wiring 32. Therefore, plasma oxidation which may carry out oxidation at low temperature is preferable. By carrying out plasma discharge in a vacuum chamber with oxygen, nitrous oxide, or the like as an oxidizing gas being introduced thereinto, oxidation at low temperature is made possible. More specifically, oxidation at 350° C. may be carried out.

Figure 3F:
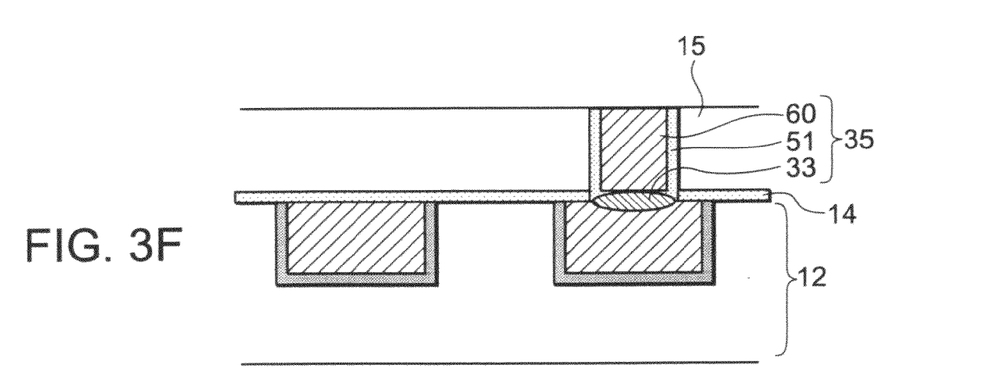

Then, as illustrated in FIG. 3F, the upper electrode layer 51 of the switch element is formed by PVD or CVD. The upper electrode layer 51 is, for example, a single layer film formed of one selected from a first group consisting of Ta, Ti, W, Ru, Pt, Ir, a nitride of Ta, a nitride of Ti, a nitride of W, a nitride of Ru, a nitride of Pt, and a nitride of Ir, or a laminated film in which two or more selected from the first group are laminated. Other noble metals or nitrides thereof may also be used as the upper electrode layer 51. Next, the via hole 21 for the switch element is filled with metal containing copper as a main element. In this way, the metal layer 60 is formed. Here, in order to prevent diffusion between the upper electrode layer 51 and the metal layer 60, a film formed of Ta, Ti, or a nitride thereof may be inserted therebetween. The metal layer 60 is formed by, for example, PVD, CVD, plating, or a combination thereof. After that, the metal layer 60 and the upper electrode layer 51 excessively formed in regions other than the region for the via hole 21 for the switch element are removed by CMP.

Figure 3G:
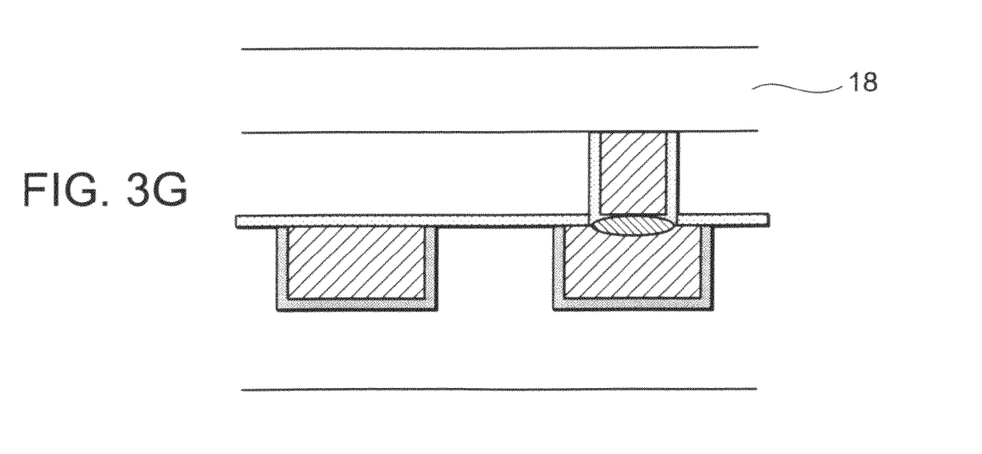

Then, as illustrated in FIG. 3G, an inter-wiring-layer insulating film 18 for forming the second wiring layer 16 is formed. The inter-wiring-layer insulating film 18 contains silicon and oxygen without fail, and, in addition, contains any one of or both of carbon and hydrogen.

Figure 4H:
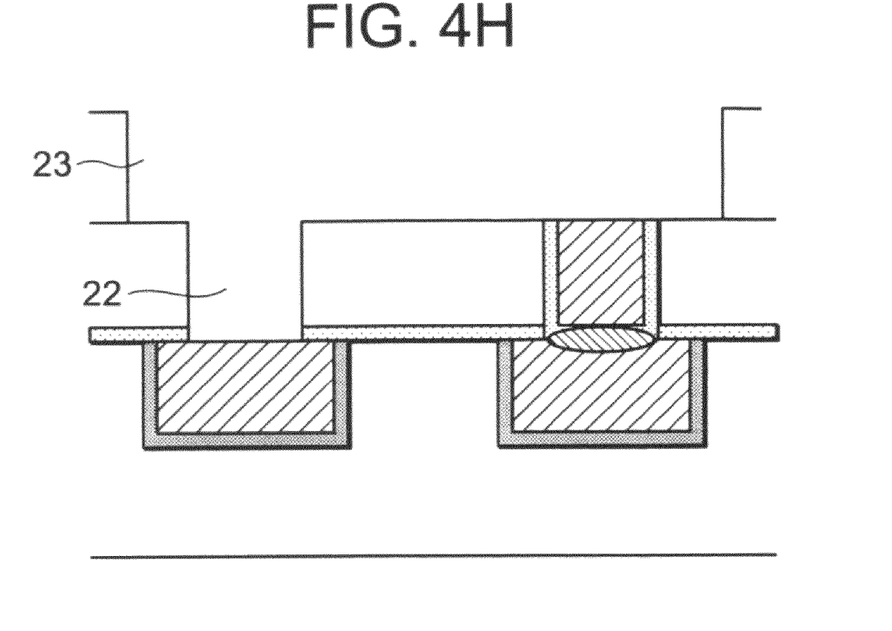
FIGS. 4H and 4I are sectional views illustrating the method of manufacturing the semiconductor device illustrated in FIG. 1.

Next, as illustrated in FIG. 4H, a via hole 22 for the wiring via for forming the wiring via 38 and a groove 23 for forming second wiring are formed by etching. An upper surface of the metal layer 60 is exposed at the bottom of the groove 23 for forming the second wiring.

Figure 4I:
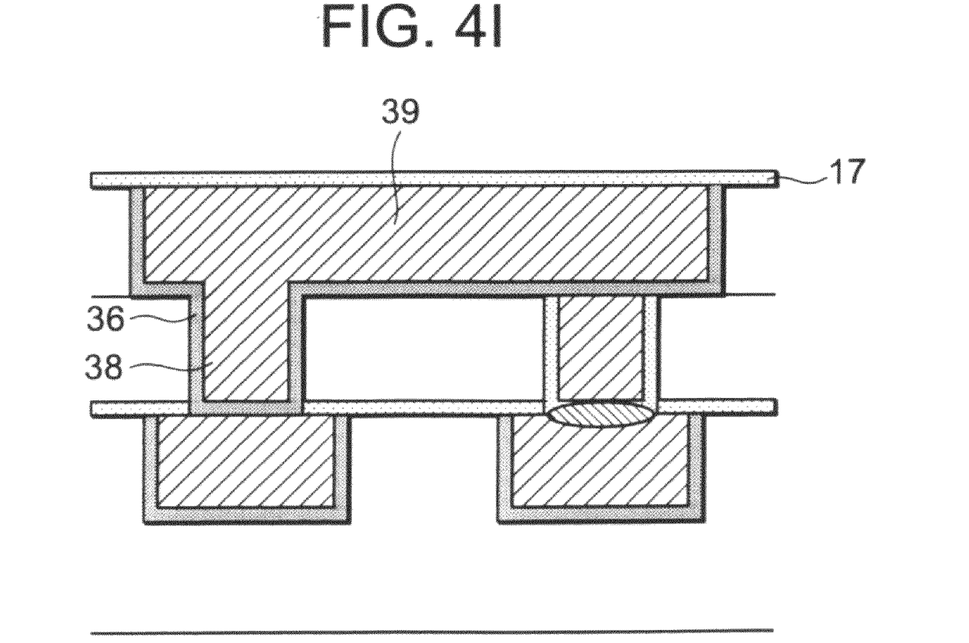

Then, as illustrated in FIG. 4I, a film of the barrier metal 36 is formed on the bottom surfaces and on sides of the via hole 22 for the wiring via and the groove 23 for forming the second wiring by PVD, CVD, or the like. One or more metal layers containing Ta, Ti, or a nitride thereof are used as the barrier metal 36. Then, metal containing copper as a main element is embedded in the entire via hole 22 for the wiring via and groove 23 for forming the second wiring by plating, CVD, or the like. Finally, excess metal is removed by chemical mechanical polishing (CMP) such that the metal is embedded only in the via hole and the groove. In this way, the wiring via 38 and the second wiring 39 are formed.

Then, the second wiring cap film 17 is formed by CVD so as to cover the second wiring 39. An insulating film containing at least two elements of silicon, carbon, and nitrogen is used as the wiring cap film. After that, multilayer wiring may be formed as necessary.

Next, action and effects of this embodiment are described. According to this embodiment, the resistance change layer 33 is formed at least at the bottom of the switch via 35, and hence it is not necessary to provide the resistance change layer 33 on the surface of the switch via 35. Therefore, deterioration of the resistance change layer 33 in the process of forming the groove 23 for forming the second wiring above the switch via 35 is suppressed. Further, the resistance change layer 33 is formed at the bottom of the switch via 35, and hence the first wiring 32 is not exposed to the atmosphere in the process of forming the resistance change layer 33. Therefore, the switch element including the resistance change layer 33 having a resistance value which changes by the history of the applied electric field may be formed in the multilayer wiring, and in addition, damage of the surface of the first wiring 32 or of the resistance change layer 33 may be suppressed.

Further, the switch element may be formed using oxidation of the metal layer existing in the via hole 21 for the switch element (in this embodiment, first wiring 32) and the single damascene process. Therefore, it is not necessary to carry out etching when the switch element is formed. Further, in the process of forming the resistance change layer 33, the copper wiring surface of the first wiring 32 thereunder may be protected in regions other than the region to be the resistance change layer 33. Therefore, a semiconductor device including a switch element between arbitrary wiring layers may be provided.

Further, the wiring via 38 which is not the switch via 35 may be formed of dual damascene wiring, and the switch via 35 is connected to the second wiring 39 as upper layer wiring in the dual damascene process. Therefore, the number of additional process steps for forming wiring is small.

Second Embodiment

Figure 5:
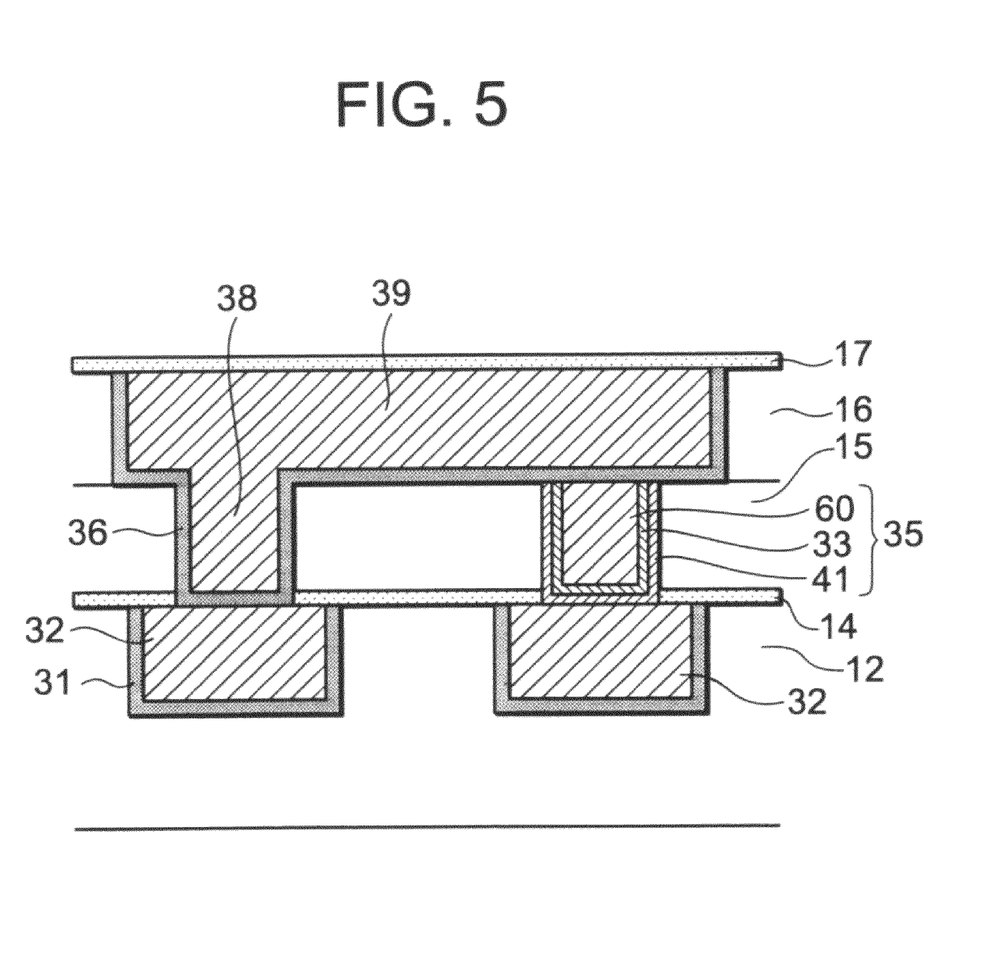
FIG. 5 is a sectional view illustrating a configuration of a semiconductor device according to a second embodiment of the present invention.

FIG. 5 is a sectional view illustrating a configuration of a semiconductor device according to a second embodiment. The semiconductor device has a configuration similar to that of the semiconductor device according to the first embodiment except for the following points. First, the switch element includes a lower electrode layer 41. Secondly, the resistance change layer 33 is formed on top of the lower electrode layer 41. Thirdly, the upper electrode layer 51 is not formed and the metal layer 60 functions as an upper electrode.

The lower electrode layer 41 is located between the first wiring 32 and the resistance change layer 33. The lower electrode layer 41 and the resistance change layer 33 are formed at the bottom and on the side of the switch via 35.

Next, a method of manufacturing the semiconductor device illustrated in FIG. 5 is described with reference to FIG. 6. The method of manufacturing the semiconductor device is similar to that of the case of the first embodiment until the via hole 21 for the switch element is formed and after the metal layer 60 is formed, and thus, description thereof is omitted.

Figure 6A:
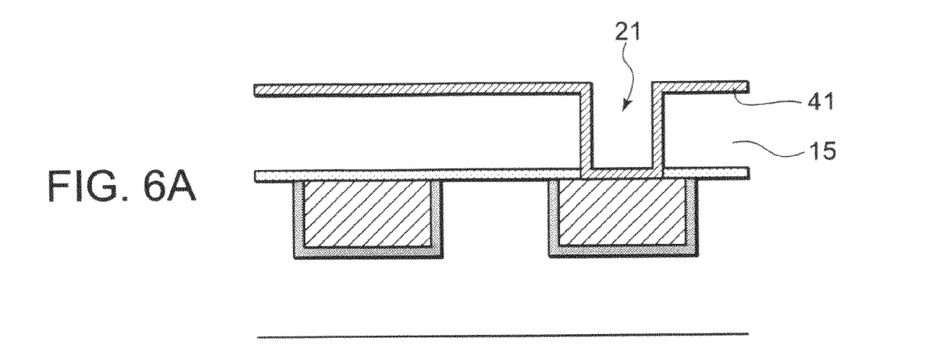
FIGS. 6A to 6C are sectional views illustrating a method of manufacturing the semiconductor device illustrated in FIG. 5.

After the via hole 21 for the switch element is formed, as illustrated in FIG. 6A, the lower electrode layer 41 is formed at the bottom and on a side of the via hole 21 for the switch element and on the first via interlayer insulating film 15. A metal selected from a group consisting of Al, Ti, Fe, Ni, Cu, Zr, Nb, Ta, and W, a mixture of two or more selected from the group, or a nitride thereof is used as the lower electrode layer 41.

Figure 6B:
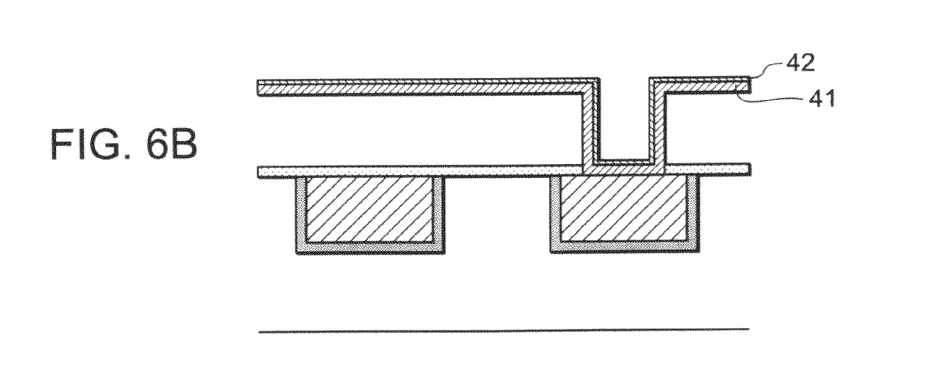
Figure 6C:
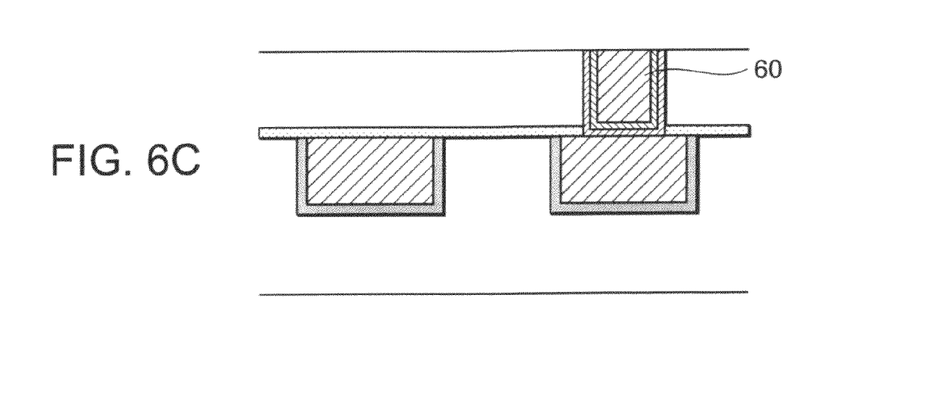

Then, as illustrated in FIG. 6B, the resistance change layer 33 is formed on a surface of the lower electrode layer 41. The resistance change layer 33 is formed by, for example, oxidizing the surface of the lower electrode layer 41. In order to oxidize metal, oxygen and energy for promoting the oxidation are necessary. When the energy is given in the form of heat, a relatively high temperature is necessary, which causes problems such as deterioration of wiring metal therebelow. Therefore, plasma oxidation which may carry out oxidation at low temperature is preferable. By carrying out plasma discharge in a vacuum chamber with oxygen, nitrous oxide, or the like as an oxidizing gas being introduced thereinto, oxidation at low temperature is made possible. More specifically, oxidation at 300 to 400° C. may be carried out.

Further, the resistance change layer 42 may be formed on the lower electrode layer 41 by PVD, CVD, or the like. In this case, the resistance change layer 42 is not limited to an oxide, and a silicide film which is a film of an alloy of a metal and silicon, a silicate film which is formed by oxidizing a silicide film, or the like may also be used for the resistance change layer 33. Further, a film formed of a mixture of a metal oxide and another metal or silicon, a film formed of a mixture of a silicate and another metal or a metal oxide, or the like may also be used therefor. The silicide film may also be formed by applying silane ($SiH_4$) gas to a metal film.

Next, the metal layer 60 which also functions as the upper electrode layer of the switch element is formed on the resistance change layer 42.

According to this embodiment, effects similar to those of the first embodiment may be obtained. Further, the surface area of the switch element may be made larger.

Third Embodiment

Figure 7:
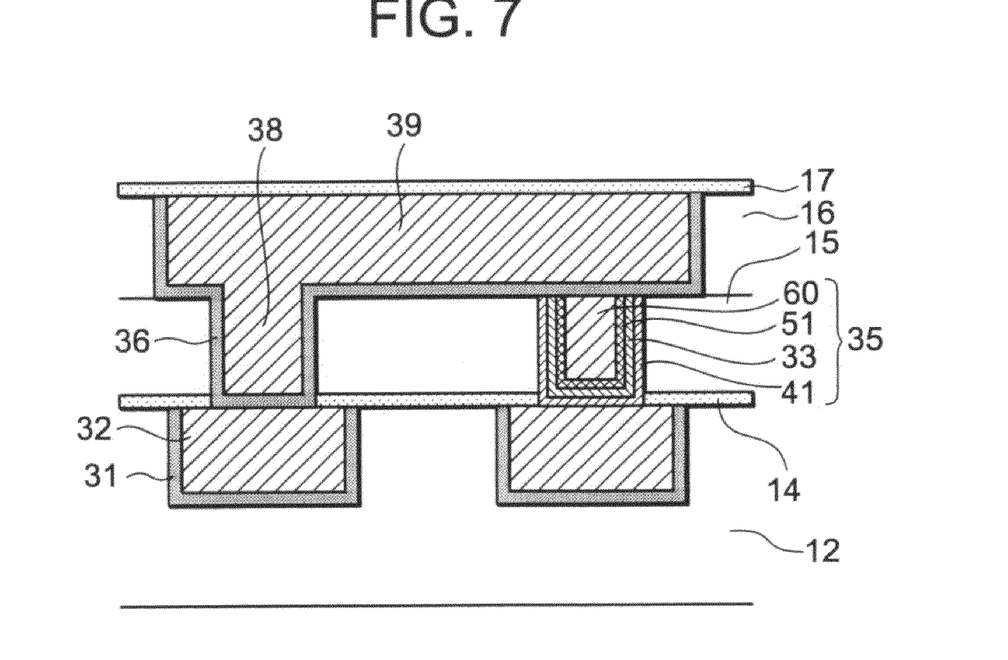
FIG. 7 is a sectional view illustrating a configuration of a semiconductor device according to a third embodiment of the present invention.

FIG. 7 is a sectional view illustrating a configuration of a semiconductor device according to a third embodiment. The semiconductor device has a configuration similar to that of the semiconductor device according to the second embodiment except that the upper electrode layer 51 is formed between the metal layer 60 and the resistance change layer 33 of the switch via 35. More specifically, in this embodiment, the lower electrode layer 41, the resistance change layer 33, and the upper electrode layer 51 are formed at the bottom and on the side of the switch via 35.

According to this embodiment, effects similar to those of the second embodiment may be obtained.

Fourth Embodiment

Figure 8:
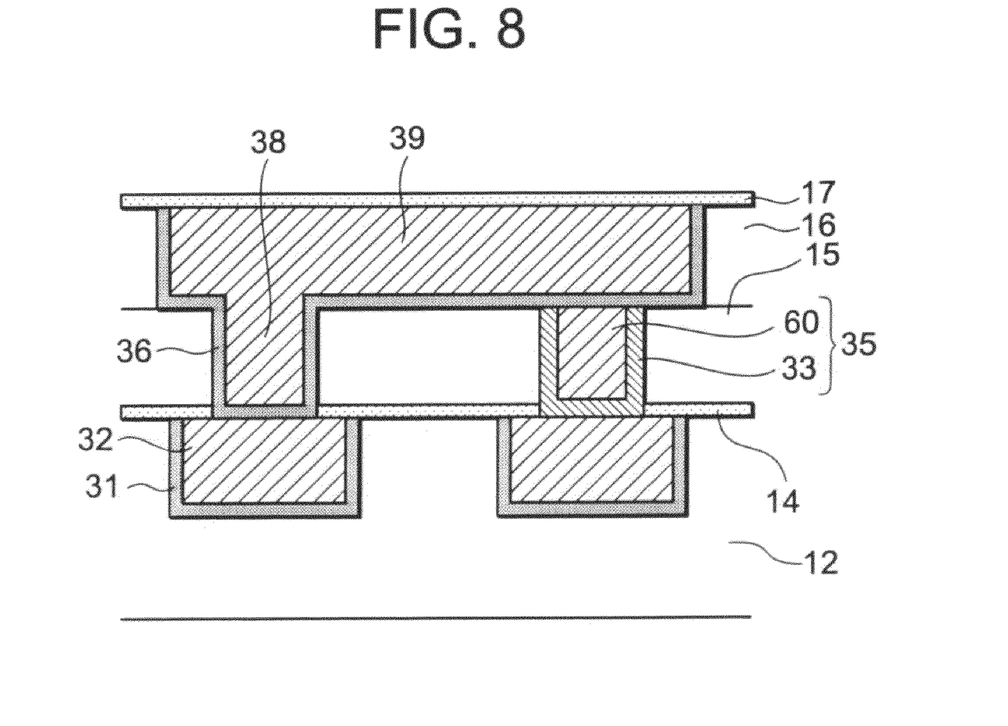
FIG. 8 is a sectional view illustrating a configuration of a semiconductor device according to a fourth embodiment of the present invention.

FIG. 8 is a sectional view illustrating a configuration of a semiconductor device according to a fourth embodiment. The semiconductor device has a configuration similar to that of the semiconductor device according to the second embodiment except that the resistance change layer 33 is formed by oxidizing the entire lower electrode layer 41 according to the second embodiment (see FIG. 5).

In this embodiment, the lower electrode layer of the switch element is the first wiring 32 while the upper electrode layer of the switch element is the metal layer 60. According to this embodiment, effects similar to those of the first embodiment may be obtained.

Fifth Embodiment

Figure 9:
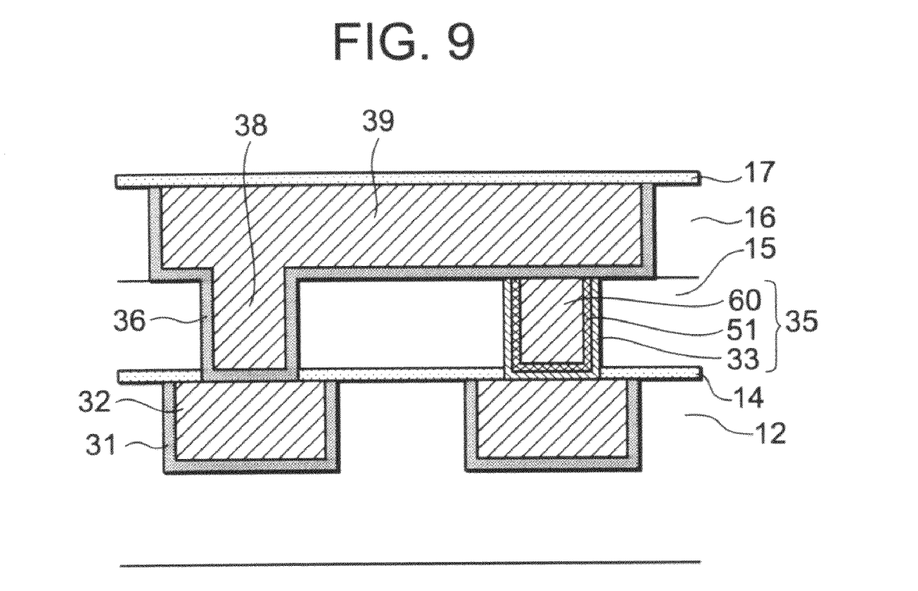
FIG. 9 is a sectional view illustrating a configuration of a semiconductor device according to a fifth embodiment of the present invention.

FIG. 9 is a sectional view illustrating a configuration of a semiconductor device according to a fifth embodiment. The semiconductor device has a configuration similar to that of the semiconductor device according to the fourth embodiment except that the upper electrode layer 51 is formed between the metal layer 60 and the resistance change layer 33 of the switch via 35.

According to this embodiment, effects similar to those of the first embodiment may be obtained.

The embodiments of the present invention are described above with reference to the drawings. Those embodiments are only examples of the present invention, and various configurations other than those described above may also be adopted. For example, in each of the above-mentioned embodiments, another wiring layer may be located between the first wiring layer 12 and the second wiring layer 16. In this case, also, the switch via 35 connects the first wiring 32 and the second wiring 39.

What is claimed is:
1. A semiconductor device, comprising:
   a substrate;
   a first wiring layer formed over the substrate;
   a first wiring formed in the first wiring layer;
   a second wiring layer located above the first wiring layer;
   a second wiring formed in the second wiring layer;
   a wiring via for connecting the first wiring and the second wiring; and
   a switch via for connecting the first wiring and the second wiring,
   wherein the switch via comprises at a bottom thereof a resistance change layer,
   wherein the wiring via and the second wiring comprise a barrier metal,
   wherein the wiring via and the second wiring comprises a region which electrically connects the wiring via with the second wiring without the barrier metal, and
   wherein the switch via and the second wiring are further electrically connected through the barrier metal.

2. A semiconductor device according to claim 1, wherein the wiring via is formed in a layer in which the switch via is formed.

3. A semiconductor device according to claim 1, wherein the switch via comprises a metal except for the resistance change layer.

4. A semiconductor device according to claim 3, wherein the resistance change layer includes an upper electrode layer located between the metal forming the switch via and the resistance change layer.

5. A semiconductor device according to claim 4, wherein the resistance change layer and the upper electrode layer are formed at the bottom and on a side of the switch via.

6. A semiconductor device according to claim 4, wherein the upper electrode layer includes one of a single layer film comprising one selected from a first group consisting of Ta, Ti, W, Ru, Pt, Ir, a nitride of Ta, a nitride of Ti, a nitride of W, a nitride of Ru, a nitride of Pt, and a nitride of Ir, and a laminated film in which two or more selected from the first group are laminated.

7. A semiconductor device according to claim 1, wherein the resistance change layer is directly connected to the first wiring.

8. A semiconductor device according to claim 1, wherein the switch via comprises a switch element that includes a lower electrode layer located between the first wiring and the resistance change layer.

9. A semiconductor device according to claim 8, wherein the resistance change layer and the lower electrode layer are formed at the bottom and on a side of the switch via.

10. A semiconductor device according to claim 1, wherein the resistance change layer includes a metal oxide layer.

11. A semiconductor device according to claim 10, wherein the resistance change layer includes an oxide of copper.

12. A semiconductor device according to claim 1, wherein the first wiring and the second wiring comprise a metal comprising 95 wt % or more copper.

13. A semiconductor device according to claim 1, wherein the second wiring comprises a dual damascene structure.

14. A semiconductor device according to claim 1, wherein the second wiring layer comprises a wiring layer which is immediately above the first wiring layer.

15. A semiconductor device, comprising:
a substrate;
a first wiring layer formed over the substrate;
a first wiring formed in the first wiring layer;
a second wiring layer located above the first wiring layer;
a second wiring formed in the second wiring layer;
a wiring via for connecting the first wiring and the second wiring; and
a switch via for further connecting the first wiring and the second wiring,
wherein the switch via comprises a resistance change layer,
wherein the switch via comprises a single damascene structure, and
wherein the wiring via comprises a dual damascene structure.

16. A semiconductor device according to claim 15, wherein the switch via and the wiring layer are formed in a same layer.

17. A semiconductor device according to claim 15, wherein the second wiring comprises a barrier metal, and the switch via is directly connected to the barrier metal of the second wiring.

18. A semiconductor device according to claim 15, wherein the switch via and the wiring via have substantially a same height in a sectional view.

19. A semiconductor device according to claim 15, wherein the resistance change layer is formed at a bottom of the switch via.

20. A semiconductor device according the claim 15, wherein the resistance change layer comprises a metal oxide.

* * * * *